United States Patent
Noda

(10) Patent No.: US 8,278,989 B2
(45) Date of Patent: Oct. 2, 2012

(54) SEMICONDUCTOR DEVICE INCLUDING ANALOG CIRCUIT AND DIGITAL CIRCUIT

(75) Inventor: Hiromasa Noda, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 134 days.

(21) Appl. No.: 12/955,635

(22) Filed: Nov. 29, 2010

(65) Prior Publication Data

US 2011/0131440 A1  Jun. 2, 2011

(30) Foreign Application Priority Data

Nov. 30, 2009  (JP) ................................. 2009-271515

(51) Int. Cl.
    *H03H 11/26* (2006.01)
(52) U.S. Cl. .......................... 327/270; 327/276; 327/278
(58) Field of Classification Search .................. 327/270, 327/271, 272, 276, 277, 278
    See application file for complete search history.

(56) References Cited

U.S. PATENT DOCUMENTS

| | | | |
|---|---|---|---|
| 6,559,699 B2 * | 5/2003 | Lee et al. | 327/276 |
| 6,927,605 B2 * | 8/2005 | Fetzer et al. | 327/101 |
| 7,394,301 B2 * | 7/2008 | Fetzer et al. | 327/262 |
| 2001/0048331 A1 | 12/2001 | Hirabayashi | |

* cited by examiner

*Primary Examiner* — Hai L Nguyen
(74) *Attorney, Agent, or Firm* — Sughrue Mion, PLLC

(57) ABSTRACT

A semiconductor device includes an analog circuit with a first delay variation in response to a variation in a power supply potential, and a digital circuit with a second delay variation smaller than the first delay variation. The analog circuit is connected to a first power supply potential. The digital circuit includes a detecting circuit detecting a first delay caused by a first circuit connected to the first power supply potential, and a second circuit generating a control signal to control the analog circuit, the second circuit being connected to a second power supply potential whose potential variation is smaller than the first power supply potential. A second delay caused by the second circuit is controlled in correlation to the first delay.

20 Claims, 10 Drawing Sheets

SEMICONDUCTOR DEVICE INCLUDING ANALOG CIRCUIT AND DIGITAL CIRCUIT

BACKGROUND OF THE INVENTION

1. Field of the Invention

The present invention relates to a semiconductor device including analog circuits and digital circuits, a method of controlling such a semiconductor device, and a system incorporating such a semiconductor device.

2. Description of the Related Art

Semiconductor devices include various circuits which are generally categorized into digital circuits and analog circuits. A digital circuit is a circuit for handling logic signals that can be represented by logic values according to binary logic or the like, e.g., performing various logic operations on logic signals and inputting and outputting logic signals. The digital circuit is also known as a logic circuit. A delay circuit for giving a time delay to a logic signal can be constructed as a digital circuit. An analog circuit, which refers to all circuits other than digital circuits, is a circuit for handling signals that cannot be represented by logic values and continuously variable signals indicative of physical quantities. Typical analog circuits include an amplifying circuit such as sense amplifier.

Many semiconductor devices are of a hybrid nature including both digital circuit portions and analog circuit portions. For example, one such semiconductor device is a dynamic random access memory (DRAM). The DRAM has a memory array area including sense amplifiers as analog circuits and a control circuit as a digital or logic circuit for controlling the operation timing of a memory array, i.e., the timing to activate the sense amplifiers.

The operational speeds of the circuits of a semiconductor device depend on the power supply voltages that are supplied to those circuits. Generally, a circuit which is supplied with a higher power supply voltage has a higher operational speed, and a circuit which is supplied with a lower power supply voltage has a lower operational speed. Digital or logic circuits may have their operational speeds less dependent on their power supply voltages, and analog circuits may have their operational speeds more dependent on their power supply voltages. If one semiconductor device has a plurality of logic circuit blocks, then these logic circuit blocks have their operational speeds equally tending to be dependent on their power supply voltages. Even when the power supply voltages of the logic circuit blocks change, the operational speeds of the logic circuit blocks do not greatly change relatively to each other. However, if one semiconductor device has logic circuit blocks and analog circuit blocks, then when their power supply voltages change, the operational speeds of the logic circuit blocks and the analog circuit blocks greatly change relatively to each other. In case the logic or digital circuit blocks control the analog circuit blocks, there is possibility that guarantee of normal operation of the semiconductor device will be lost.

In the memory array area of the DRAM referred to above, the operational speed of the control circuit which controls the timing to activate the memory array is less dependent on its power supply voltage, whereas the operational speeds of the sense amplifiers to amplify data stored in memory cells are more dependent on their power supply voltages. For guaranteeing normal operation of the memory array area, it is necessary to eliminate a mismatch between the operational speeds of the control circuit and the memory array. Since it is difficult to make the operational speeds of the sense amplifiers less dependent on their power supply voltages, efforts need to be made to eliminate the operational speed mismatch by making the timing of signals supplied from the control circuit to the sense amplifiers, as dependent on power supply voltages as the operational speeds of the sense amplifiers are dependent on their power supply voltages.

As a technology for compensating for a change in the operational speed of an analog circuit caused by an external factor, there is disclosed a semiconductor integrated circuit which can changes delay time of a delayed clock signal in synchronism with a change in frequency of an input clock signal, in US 2001/0048331 A1. The disclosed semiconductor integrated circuit employs a delay circuit comprising a plurality of CMOS (complementary metal-oxide-semiconductor) inverters connected in series for delaying a clock signal as a logic signal. The CMOS inverters of the delay circuit include respective transistors having respective sources connected to current sources which are controlled by a detection signal related to the frequency of the input clock signal. The delay circuit disclosed in US 2001/0048331 A1 has its delay time changing in synchronism with a change in the frequency of the input clock signal. US 2001/0048331 A1 is neither concerned with the elimination of a mismatch between the operational speeds of a digital circuit and an analog circuit because the operational speeds depend on their power supply voltages differently, nor suggests problems caused by the mismatch.

In a semiconductor device having an analog circuit and a digital circuit, a mismatch tends to occur between the operational speed of the analog circuit and the operational speed of the digital circuit due to a change in a power supply voltage that is supplied to the semiconductor device. If the power supply voltage changes and, for example, the operation timing of the analog circuit is controlled by an output signal from the digital circuit, then the semiconductor device is liable to fail to operate normally on account of the mismatch.

SUMMARY in one embodiment, there is provided a semiconductor device that includes an analog circuit and a digital circuit. The analog circuit has a first delay variation in response to a variation in a power supply potential supplied to the analog circuit, the analog circuit being connected to a first power supply potential. The digital circuit has a second delay variation smaller than the first delay variation in response to the variation in the power supply potential. The digital circuit includes: a detecting circuit detecting a first delay which occurs in a first circuit connected to the first power supply potential; and a second circuit generating a control signal to control the analog circuit, the second circuit being connected to a second power supply potential whose potential variation is smaller than the first power supply potential.

In this configuration, the first delay occurring in the first circuit depends on a variation in the first power supply potential, and is correlated to a variation in the delay of the analog circuit due to the variation in the first power supply potential. Even though both the analog circuit having the first delay variation and the digital circuit having the second delay variation are connected to the first power supply potential, their delays caused by the variation in the first power supply potential have different transitions. The term "correlated" referred to above indicates that the control signal for controlling the analog circuit, which is generated by the "second circuit in relation to the second delay variation," is generated as a control signal related (or matched) to the first delay variation, by detecting the first delay in relation to the second delay variation. With the semiconductor device according to the embodiment, the second delay is controlled in correlation to the first delay thereby to cause the delay caused in the digital circuit by the second delay variation to match the delay caused in the analog circuit by the first delay variation.

If the relationship between the first delay variation and the second delay variation is known and the second delay variation is not nil, then even though the first circuit is constructed as the digital circuit, it is possible to determine a control variable for controlling the delay of the second circuit depending on the delay to be caused in the analog circuit by the variation in the first power supply potential, from the first delay caused in the first circuit. That the relationship between the first delay variation and the second delay variation is known means the correlated values between these delay variations are understood based on device parameters, simulations, etc. when the semiconductor device is designed. Since even the digital circuit has its operational speed depending on the power supply potential and the relationship between the first delay variation and the second delay variation is known at the stage of designing the semiconductor device, it is possible to generate the control signal that matches the characteristics of the analog circuit depending on the variation in the first power supply potential and to control the analog circuit according to the control signal.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF PREFERRED EMBODIMENTS

The technical concept of the present invention for solving the problems addressed above will be illustrated below. However, details included in the technical scope of the present invention are not limited to the technical concept, but should be interpreted as falling within the scope of the appended claims.

A semiconductor device according to the technical concept includes: an analog circuit having a first delay variation in response to a variation in a power supply potential, the analog circuit being connected to a first power supply potential; and a digital circuit generating a control signal to control the analog circuit, the digital circuit having a second delay variation smaller than the first delay variation in response to the variation in the power supply potential. The digital circuit includes: a first circuit connected to the first power supply potential and having a first delay caused when the first circuit is supplied with a first signal and propagates the first signal in relation to the second delay variation; a detecting circuit outputting a detected value corresponding to the first delay; and a second circuit connected to a second power supply potential whose potential variation is smaller than the first power supply potential. The second circuit is supplied with a second signal and generates the control signal which has a second delay in relation to the second delay variation. The second delay is controlled to change from the second delay variation to the first delay variation in correlation to the first delay which is indicated by the detected value.

In such a technical concept, the first circuit may comprise a digital circuit, for example. If the first circuit comprises a digital circuit, then it may include a plurality of series-connected delay elements as delay stages. A value corresponding to the variation in the first power supply potential can be determined by detecting how much a signal has been propagated through the delay stages within a predetermined delay time period.

Figure 1:
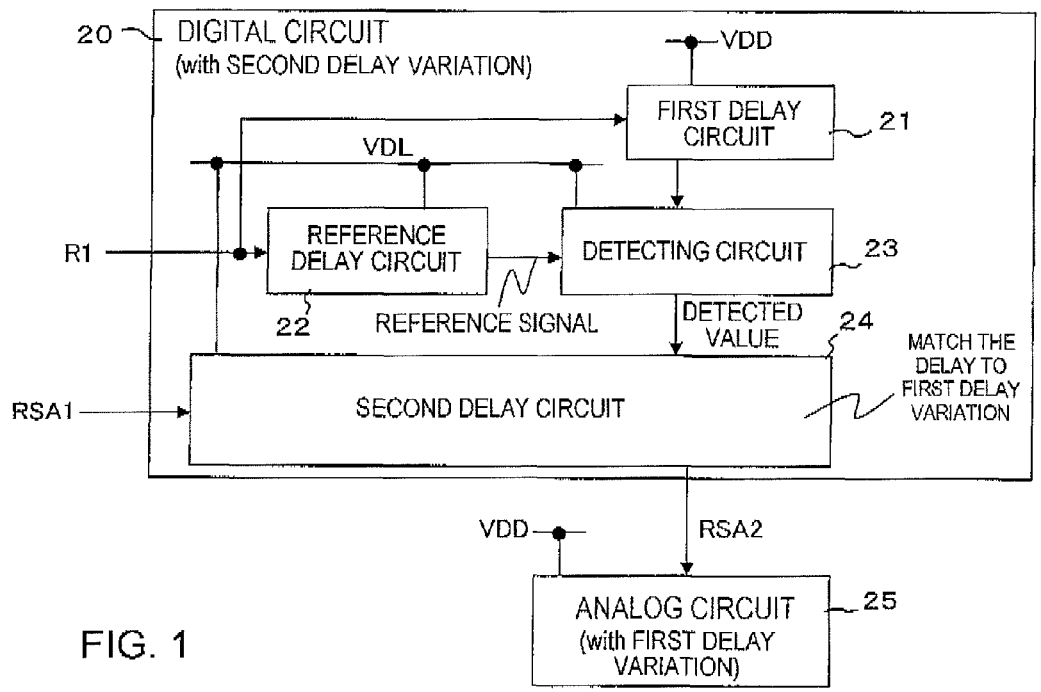
FIG. 1 is a block diagram showing the basic principles of a semiconductor device according to an exemplary embodiment of the present invention.

FIG. 1 shows a configurational example of a semiconductor device according to the principles of the above technical concept. The semiconductor device shown in FIG. 1 operates under first power supply voltage VDD whose potential is variable and second power supply voltage VDL whose potential is less variable than first power supply voltage VDD. First power supply voltage VDD represents an external power supply potential that is supplied from an external circuit to the semiconductor device. Second power supply voltage VDL is generated in the semiconductor device by a regulator circuit or a step down circuit that is supplied with first power supply voltage VDD. The regulator circuit or the step down circuit supplies a prescribed constant potential as second power supply voltage VDL irrespective of potential variations of first power supply voltage VDD. Since the regulator circuit or the step down circuit is unable to completely eliminate its potential dependency on potential variations of first power supply voltage VDD and temperature variations, the potential supplied from the regulator circuit or the step down circuit tends to fluctuate. According to the present technical concept, however, as second power supply voltage VDL is less variable in potential than first power supply voltage VDD, the problems addressed above can be solved. Second power supply voltage VDL may be supplied from an external circuit to the semiconductor device, rather than being generated in the semiconductor device.

As shown in FIG. 1, the semiconductor device comprises digital circuit 20 and analog circuit 25. Analog circuit 25 is supplied with first power supply voltage VDD and operates under first power supply voltage VDD. Digital circuit 20 supplies analog circuit 25 with control signal RSA2 controlling analog circuit 25.

Digital circuit 20 includes: first delay circuit 21 connected to first power supply VDD; reference delay circuit 22 connected to second power supply VDL and operable under second power supply voltage VDL, reference delay circuit 22 having a known signal propagation time from its input terminal to its output terminal; detecting circuit 23 for detecting a delay caused by first delay circuit 21 by comparing an output signal from reference delay circuit 22 and an output signal from first delay circuit 21 with each other; and a second delay circuit 24 connected to second power supply VDL and operable under second power supply voltage VDL. First delay circuit 21 corresponds to a first circuit, and second delay circuit 24 corresponds to a second circuit. First delay circuit 21 and reference delay circuit 22 have respective input terminals supplied with first signal R1. Second delay circuit 24 has an input terminal supplied with second signal RSA1. A signal appearing at an output terminal of second delay circuit 24 is supplied to analog circuit as control signal RSA2. Based on the delay detected by detecting circuit 23, a delay caused by second delay circuit 24 is correlated to a delay, i.e., a first delay variation, caused by analog circuit 25 which operates under first power supply voltage VDD.

In this configuration, first delay circuit 21 may comprise a plurality of series-connected delay elements as delay stages. Each of the delay elements may comprise a plurality of series-connected inverters each having an output terminal connected to the input terminal of the following inverter, for example. Alternatively, each of the delay elements may comprise a single inverter. First signal R1 is supplied to the input terminal of the first delay element of first delay circuit 21.

Detecting circuit 23 is supplied with, as an input signal, a reference signal from reference delay circuit 22 which is the same as first signal R1 delayed a certain time and is also supplied with, as input signals, output signals from the respective delay elements of first delay circuit 21. Detecting circuit 23 may include a plurality of detectors detecting delays of the reference signal from the respective input signals from first delay circuit 21, i.e., time differences between the reference signal and the respective input signals from first delay circuit 21. Each of the detectors of detecting circuit 23 may comprise an edge detecting circuit which operates according to the reference signal to detect an edge of the waveform of the output signal from a corresponding one of the delay elements of first delay circuit 21. For example, the edge detecting circuit may comprise two NAND gates or two NOR gates which are cross-connected to each other, as with an RS flip-flop, one of the NAND gates or NOR gates being supplied with the reference signal and the other with the output signal from first delay circuit 21. Therefore, detecting circuit 23 can be understood as being a sensing circuit for detecting a first delay.

Second delay circuit 24 may comprise a plurality of series-connected inverters each having an output terminal connected to the input terminal of the following inverter, for example, wherein the signal propagation time of each inverter is controllable. For controlling the signal propagation time of each inverter, a plurality of transistors are connected parallel between the power supply terminal of the inverter and the power supply line of a second power supply potential, and as many transistors as depending on the delay detected by detecting circuit 23 are controlled to be turned on. Alternatively, second delay circuit 24 may comprise a plurality of series-connected inverters each having an output terminal connected to the input terminal of the following inverter, wherein a load connected to the junction between adjacent inverters is variable depending on the delay detected by detecting circuit 23. Second signal RSA1, which lags behind first signal R1, is supplied to the input terminal of the first inverter of second delay circuit 24. Second delay circuit 24 delays second signal RSA1 by a delay correlated to the first delay variation in analog circuit 25, and outputs delayed second signal RSA1 as control signal RSA2.

First signal R1 and second signal RSA1 are generated by a signal generating circuit, not shown. The signal generating circuit is activated each time the semiconductor device is accessed from outside. When the semiconductor device is not accessed, i.e., when it is in a standby mode, the signal generating circuit is inactive and digital circuit 20 and analog circuit 25 are also inactive. At this time, the operation to detect the signal from first delay circuit 21 also halts. When the semiconductor device is accessed, first signal R1 and second signal RSA1 are generated and output in a time sequence to digital circuit 20. A transition time of first signal R1, i.e., a time required to activate itself, is earlier than a transition time of second signal RSA1, i.e., a time required to activate itself.

Analog circuit 25 is controlled by a control signal, not shown, generated by digital circuit 20 as well as control signal RSA2 generated by digital circuit 20. The non-illustrated control signal will hereinafter be referred to as control signal X. If the semiconductor device has a memory function, for example, control signal X serves as a trigger signal for activating word lines which are connected to memory cells to access the memory cells, and control signal RSA2 serves as a trigger signal for activating sense amplifiers connected bit lines to which the memory cells are connected.

Figure 2:
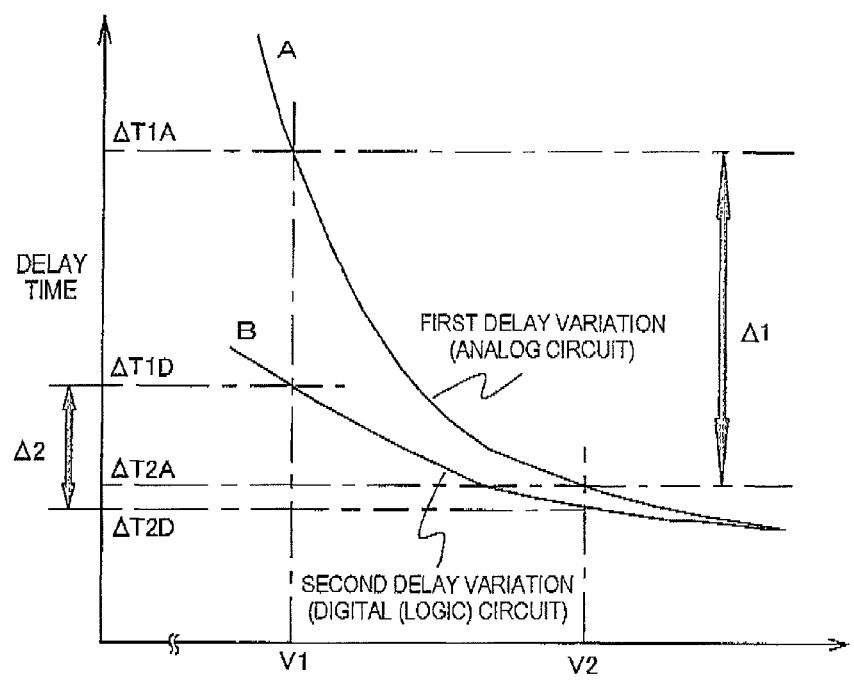
FIG. 2 is a graph showing an example of how the operational speeds of a digital circuit and an analog circuit depend on their power supply voltages.

FIG. 2 is a graph showing an example of dependency of operational speeds of a digital circuit and an analog circuit against their power supply voltages. FIG. 2 illustrates the principles of operation of the basic semiconductor device shown in FIG. 1.

As described above, generally, a circuit in a semiconductor device has characteristics that its operational time heightens and its delay time shortens as the circuit is supplied with a higher power supply voltage. Analog circuits have their operational speeds more dependent on their power supply voltages, and digital circuits have their operational speeds less dependent on their power supply voltages. In FIG. 2, curves A, B represent general operational voltage vs. delay time characteristics of an analog circuit and a digital (logic) circuit in a semiconductor device, respectively. Therefore, curve A represents a first delay variation, and curve B represents a second delay variation. It is assumed that the power supply voltage applied to the semiconductor device, i.e., first power supply voltage VOID, varies between voltages V1 and V2, where V1<V2. In a relatively high operating range, e.g., at voltage V2, the difference between delay time ΔT2A of the analog circuit and delay time ΔT2D of the digital circuit is relatively small, and the semiconductor device is free of faults due to a mismatch between these time delays. In a relatively low operating voltage range, e.g., at voltage V1, delay time ΔT1A of the analog circuit is much greater than delay time ΔT1D of the digital circuit. Between voltages V1 and V2, the delay time of the analog circuit changes by first difference Δ1 in the Figure, and the delay time of the digital circuit changes by second difference Δ2.

In the example shown in FIG. 1, the number of delay stages of first delay circuit 21, which is a digital circuit, is determined by first delay circuit 21, which operates under first power supply voltage VDD having a large voltage variation, and reference delay circuit 22 and detecting circuit 23, which operate under second power supply voltage VDL having a voltage variation small enough to be ignored compared with the voltage variation of first power supply voltage VDD. Since the number of delay stages is correlated to first power supply voltage VDD, the delay time of second delay circuit 24 is controlled so that an increase therein will be equal to the difference between the delay times of the digital circuit and the analog circuit for thereby causing the delay variation of the digital circuit to apparently match the delay variation of the analog circuit. The delay time of second delay circuit 24 can be controlled by appropriately configuring second delay circuit 24 at the stage of designing the semiconductor device based on the correlation between the first delay variation and the second delay variation, i.e., by constructing second delay circuit 24 to achieve desired delay characteristics depending on the delay detected by detecting circuit 23.

Since reference delay circuit 22 is supplied with second power supply voltage VDL, the delay (e.g., 1 nanosecond (ns)) of reference delay circuit 22 is constant regardless of variations in first power supply voltage VDD. By using first delay circuit 21 which comprises a plurality of series-connected delay elements as delay stages and detecting the delays of the delay stages based on the reference signal supplied from reference delay circuit 22 according to an edge detecting process, the delay of first detecting circuit 21 can be detected as the number of output lines which are "high" level, for example. As the delay is expressed as the number of output lines having a certain logic value, the arrangement of second delay circuit 24 for controlling the delay can be simplified.

In the above explanation, first signal R1 is applied to first delay circuit 21 and second delay circuit 22 at a timing immediately before control signal RSA2 for controlling analog circuit 25 is generated. Since the delay of second delay circuit 24 is controlled based on the delay detected immediately before the control signal applied to analog circuit 25 is generated, the delay of the control signal supplied to analog circuit 25 can reliably be controlled to match the delay of analog circuit 25 itself even if first power supply voltage VDD suffers an abrupt potential variation. As the delay of analog circuit 25 is simulated based on the actual difference between the delay of first delay circuit 21 which operates under first power supply voltage VDD and the delay of reference delay circuit 22 which operates under second power supply voltage VDL, the delay of analog circuit 25 can accurately be evaluated. Furthermore, inasmuch as all of first delay circuit 21, reference delay circuit 22, detecting circuit 23, and second delay circuit 24 are constructed as digital circuits, the circuit scale thereof can be smaller than if they are constructed as analog circuits, and can be designed with ease.

Figure 3:
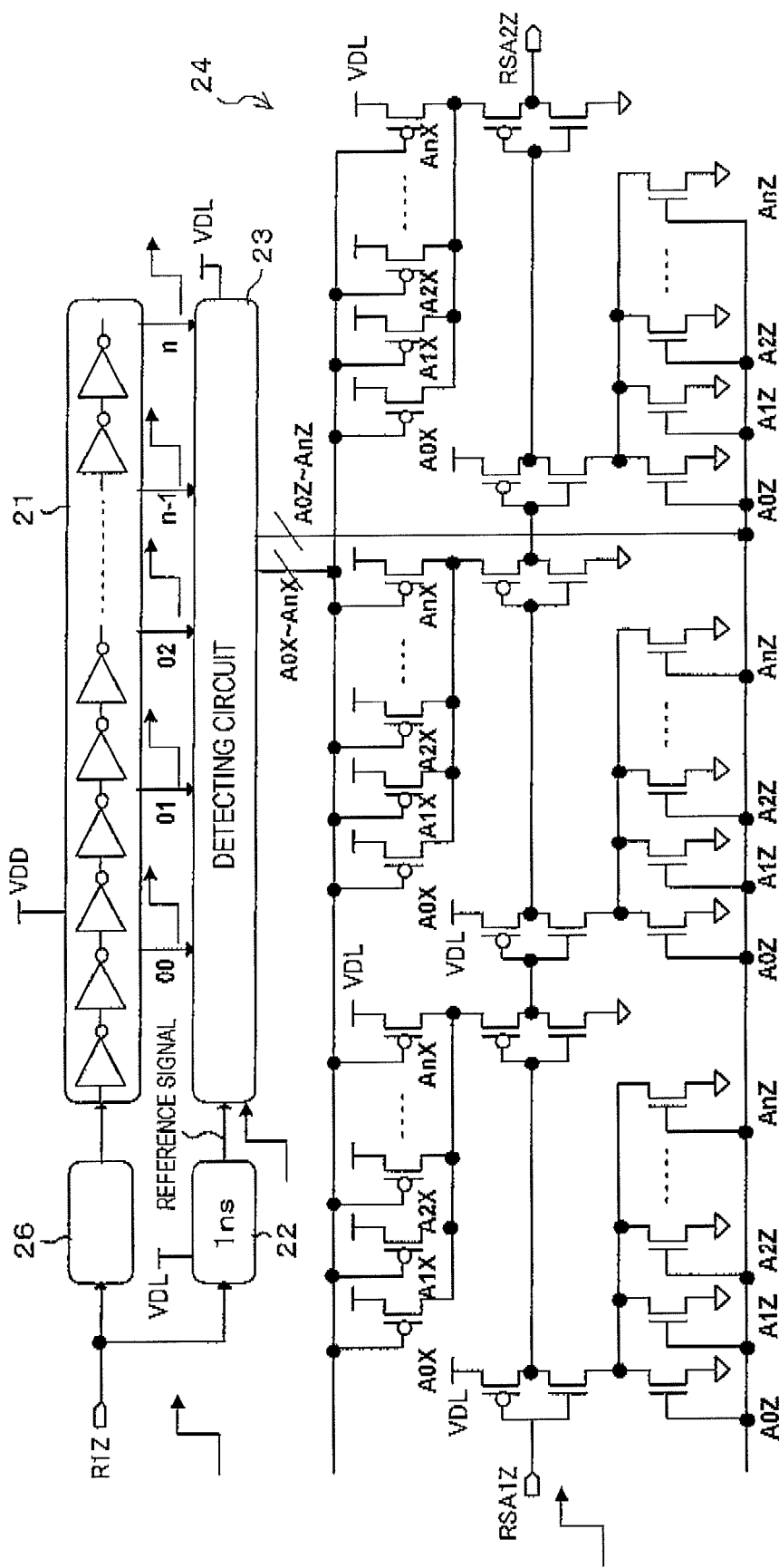
FIG. 3 is a circuit diagram showing a semiconductor device according to Example 1.

Examples of the semiconductor device according to the exemplary embodiment of the present invention will be described below. FIG. 3 is a circuit diagram showing a semiconductor device according to Example 1.

The semiconductor device shown in FIG. 3 incorporates the basic principles shown in FIG. 1. FIG. 3 shows a circuit section corresponding to digital circuit 20 shown in FIG. 1. According to Example 1, digital circuit 20 comprises first delay circuit 21, reference delay circuit 22, detecting circuit 23, and second delay circuit 24 as shown in FIG. 1, and digital circuit 20 further includes level shifting circuit 26. FIG. 3 also shows first signal R1Z, second signal RSA1Z, and control signal RSA2 output from second delay circuit 24 for controlling the analog circuit, which correspond to signals R1, RSA1, and RSA2, respectively, in FIG. 1.

Level shifting circuit 26, which serves to match the logic level of first signal R1Z to first power supply voltage VDD, is connected between the input terminal for supplying first signal R1Z and first delay circuit 21. If first signal R1Z can be input to first delay circuit 21 without level conversion, then level shifting circuit 26 may be dispensed with.

First delay circuit 21, which operates under first power supply voltage VDD, is constituted as delay stages and comprises 2(n+1) series-connected CMOS inverters each having an output terminal connected to the input terminal of the following inverter. In this case, every two series-connected CMOS inverters make up a single delay element. Therefore, first delay circuit 21 has (n+1) delay elements as delay stages. Each delay element is not limited to two inverters, but may comprise a single inverter or three or more series-connected inverters. First delay circuit 21 may comprise known logic gates instead of inverters.

Each of the delay elements of first delay circuit 21, i.e., every two inverters, supplies an output signal to detecting circuit 23. Consequently, first delay circuit 21 supplies (n+1) parallel output signals to detecting circuit 23. On the other hand, reference delay circuit 22 is supplied with first signal R1Z, delays first signal R1Z by 1 ns, for example, and outputs delayed first signal R1Z as a reference signal to detecting circuit 23. Detecting circuit 23, operates depending on the reference signal, has as many detectors as the number of input signals from first delay circuit 21. The detectors comprise edge detecting circuits for detecting edges in the input waveforms from first delay circuit 21.

Figure 4:
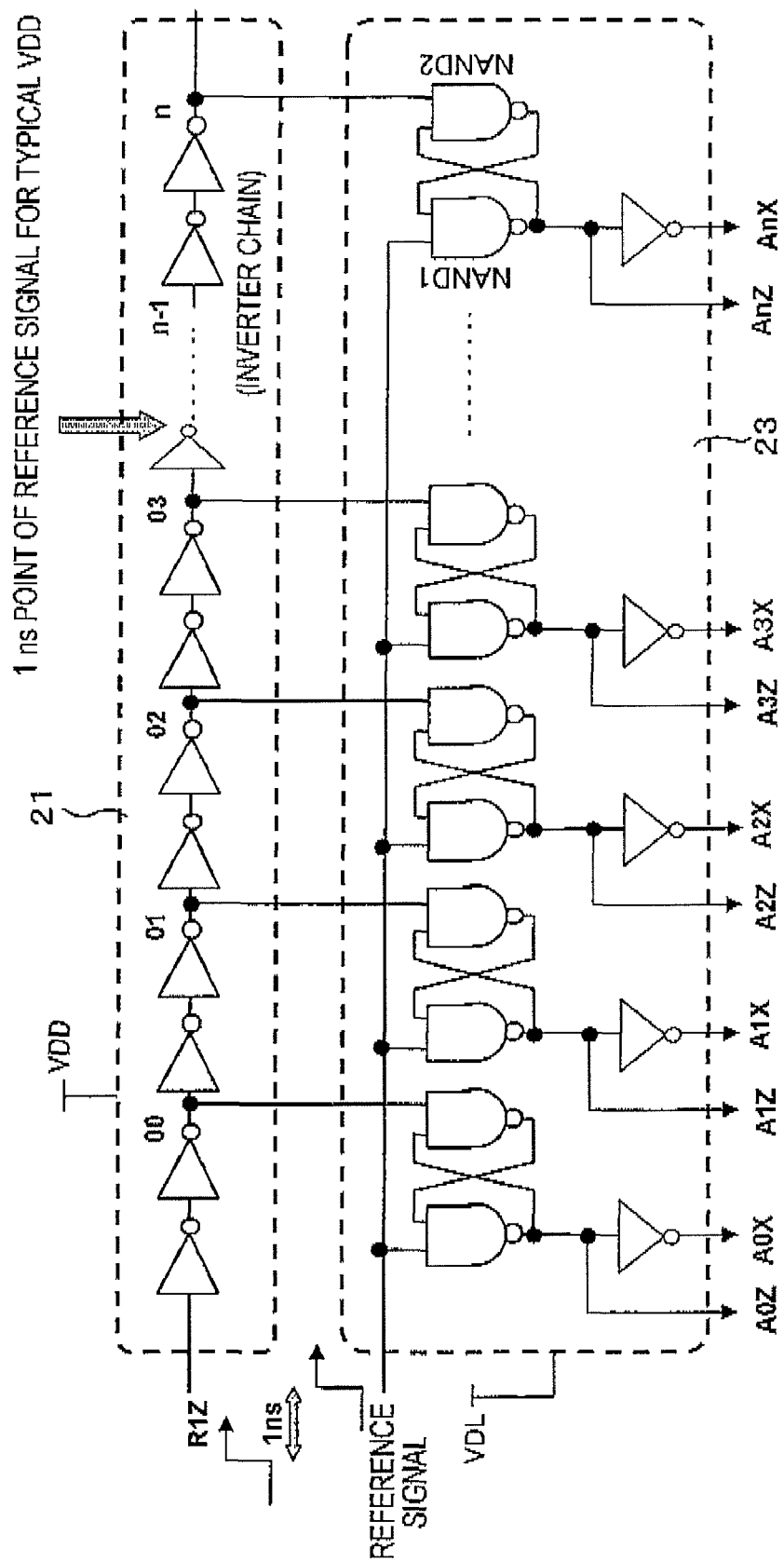
FIG. 4 is a circuit diagram showing a configurational example of a first delay circuit and a detecting circuit.

Circuit details of first delay circuit 21 and detecting circuit 23 are shown in FIG. 4. As shown in FIG. 4, each of the' detectors of detecting circuit 23 comprises two NAND gates which are cross-connected to each other, as with an RS flip-flop, the first NAND gate (NAND1) being supplied with the reference signal and the second NAND gate (NAND2) with the output signal from first delay circuit 21. The first NAND gate of each detector produces at its output terminal a positive-logic output signal of the detector. The output terminal of the first NAND gate is connected to an inverter which produces a negative-logic output signal of the detector. The detector of detecting circuit 23 that corresponds to the i-th input line from first delay circuit 21 produces output signals AiZ and AiX whose logic levels are complementary to each other. As a result, detecting circuit 23 outputs 2(n+1) signals represented by A0Z to AnZ and A0X to ZnX to second delay circuit 24.

As shown in FIG. 3, second delay circuit 24 comprises a plurality of series-connected CMOS inverters each having an output terminal connected to the input terminal of the following inverter. The plurality of series-connected CMOS inverters constituting second delay circuit 24 include odd-numbered CMOS inverters and even-numbered CMOS inverters. Each of the odd-numbered CMOS inverters comprises a main P-channel MOS transistor, a main N-channel MOS transistor, and (n+1) parallel-connected control N-channel MOS transistors functioning as current-source control elements, the main P- and N-channel MOS transistors constituting a main portion of a typical inverter. The main NI-channel MOS transistor is connected to a ground potential through the (n+1) parallel-connected control N-channel MOS transistor. The (n+1) control N-channel MOS transistors have respective gates supplied with output signals A0Z to AnZ from detecting circuit 23. Similarly, each of even-numbered CMOS inverters has a main P-channel MOS transistor, a main N-channel MOS transistor, and (n+1) parallel-connected control P-channel MOS transistors functioning as current-source control elements, the main P- and N-channel MOS transistors constituting a main portion of a typical inverter. The main P-channel MOS transistor is connected to a power supply line through the (n+1) parallel-connected control P-channel MOS transistors. The (n+1) control P-channel MOS transistors have respective gates supplied with output signals A0X to AnX from detecting circuit 23. The power supply line carries second power supply voltage VDL. The above circuit arrangement of second delay circuit 24 serves to delay only rising edges of second signal RSA1Z. If falling edges of second signal RSA1Z are to be delayed, then current-source control elements may be connected to the CMOS inverters in positions which are switched around from those shown in FIG. 3. If both rising and falling edges of second signal RSA1Z are to be delayed, current-source control elements may be connected to both the main P- and N-channel MOS transistors of the CMOS inverters. It is obvious to those skilled in the art to change the layout of current-source control elements depending on which of rising and falling edges of second signal RSA1Z are to be delayed. Second delay circuit 24 may comprise known logic gates rather than inverters. Actually, each of the inverters often performs logic synthesis with various signals. The first one of the CMOS inverters which is supplied with second signal RSA1Z is a first logic gate, and the last one of the CMOS inverters which outputs control signal RSA2Z is a last logic gate.

Operation of the semiconductor device will be described below.

Reference delay circuit 22 supplies first signal R1Z as the reference signal to detecting circuit 23 with a time delay of 1 ns from first signal R1Z that is supplied to first delay circuit 21. Since reference delay circuit 22 operates under second power supply voltage VDL whose potential variation is smaller than first power supply voltage VDD, the time difference of 1 ns does not change even if first power supply voltage VDD suffers a potential variation. A rising edge of first signal R1Z will be considered below. When the semiconductor device is in a standby mode, the reference signal is low in level, and all output signals Ai, i.e., output signals A0Z to AnZ, from detecting circuit 23 are high in level. Now, attention is given to changes in the output signals from the second NAND gates (NAND2) of the respective detectors of detecting circuit 23. It is assumed hereinbelow that the time at which first signal R1Z at the input terminal of first delay circuit 21 transits from low to high in level is used as a time reference. A rising edge of first signal R1Z propagates through the row of inverters, i.e., the series-connected delay elements, of first delay circuit 21. When first signal R1Z rises at the output terminal of the delay element denoted by "00", i.e., the first delay element, the output signal from the second NAND gate of the detector corresponding to the delay element denoted by "00" goes low. Therefore, output signal A0Z from detecting circuit 23 is kept high. Output signal AiZ from the second NAND gate, which corresponds to the delay element where first signal R1Z has already risen within 1 ns before the reference signal rises, is kept high when the reference signal goes high upon elapse of 1 ns. On the other hand, the output signal from the second NAND gate, which corresponds to a delay element where first signal R1Z has not risen upon elapse of 1 ns, is high. As the reference signal is also high, both input signals to the first NAND gate are high, making output signal AiZ low. If first power supply voltage VDD is high, then the delay times of the respective inverters of first delay circuit 21 are shortened, allowing first signal R1Z to propagate more quickly through the row of inverters. Therefore, upon elapse of 1 ns, the number of delay elements corresponding to high output signals AiZ is increased. In other words, more output signals AiZ are high in the direction from the delay element denoted by "00" to the delay element denoted by "n". If first power supply voltage VDD is low, then the delay times of the respective inverters of first delay circuit 21 are increased, causing first signal R1Z to propagate more slowly through the row of inverters. Therefore, upon elapse of 1 ns, the number of high output signals AiZ is reduced. The above output signal transitions are tabulated as a truth table in Table 1 below.

TABLE 1

| | | A0Z | A1Z | A2Z | A3Z | A4Z | ... | An-1Z | AnZ |
|---|---|---|---|---|---|---|---|---|---|
| First power supply voltage (VDD) | High | High→High | High→High | High→High | High→High | High→Low | ... | High→Low | High→Low |
| | Typical | High→High | High→High | High→High | High→Low | High→Low | ... | High→Low | High→Low |
| | Low | High→High | High→High | High→Low | High→Low | High→Low | ... | High→Low | High→Low |

Signals AiX are given as logic inversions of signals AiZ. Signals A0Z to AnZ, A0X to AnX thus determined are supplied from detecting circuit 23 to second delay circuit 24. As described above, each of the CMOS inverters of second delay circuit 24 is combined with (n+1) control transistors as current source control elements. Of the (n+1) control transistors, as many transistors as the number of high output signals AiZ from detecting circuit 23 are turned on, with remaining control transistors being turned off. As the number of control transistors which are turned on is greater, the delay times of the CMOS inverters are reduced, thereby reducing the delay time of second signal RSA1Z propagating through second delay time 24. Conversely, as the number of control transistors corresponding to high output signals AiZ from detecting circuit 23 is smaller, the delay time of second signal RSA1Z propagating through second delay time 24 is increased. Thus, by establishing propagation delay time of reference delay circuit 22 and characteristics of the current source control elements of second delay circuit 24 based on the correlation between the first delay variation of the analog circuit and the second delay variation of the digital circuit, it is possible to match the delay of second delay circuit 24 to the delay of the analog circuit due to the variation in first power supply voltage. VDD. The detected signals (A0X to AnX, A0Z to AnZ) delivered from the respective detectors, each comprising two NAND gates, NAND1 and NAND2, represent a detected value of detecting circuit 23. The detected value may alternatively be represented by one or more detected signals according to any of various formats.

Figure 5:
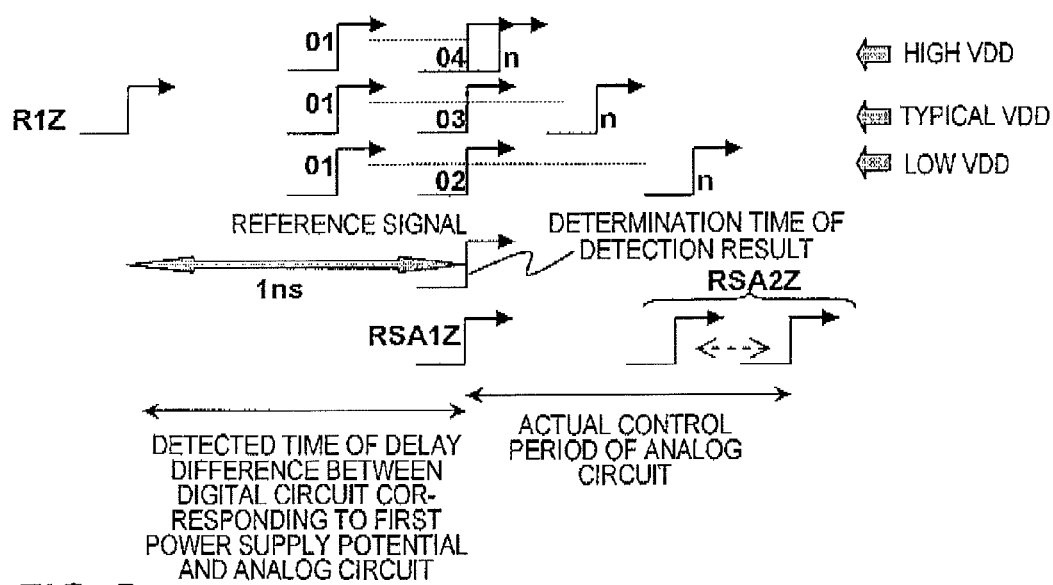
FIG. 5 is a diagram illustrating the operation of the semiconductor device of Example 1.

FIG. 5 is a waveform diagram showing how the detected value from detecting circuit 23 and the delay of second delay circuit 24 are associated with each other.

In the semiconductor device described above, the delay of first delay circuit 21 is determined based on a rising edge of first signal R1Z. However, the delay of first delay circuit 21 may alternatively be determined based on a falling edge of first signal R1Z. If the delay of first delay circuit 21 is to be determined based on a falling edge of first signal R1Z, then the NAND gates of detecting circuit 23 may be replaced with NOR gates. Though the number of control elements connected to each of the inverters of second delay circuit 24 is equal to the number of detectors of detecting circuit 23, the number of control elements may be reduced if the circuit scale of second delay circuit 24 tends to be too large. In the above example, each of the inverters of second delay circuit 24 is combined with (n+1) control elements because detecting circuit 23 includes (n+1) detectors. However, the number of control elements of each inverter may be represented by about n/5, and each of the control elements may be controlled by the output signals from every five detectors, e.g., the first detector, the sixth detector, and so on.

Figure 6:
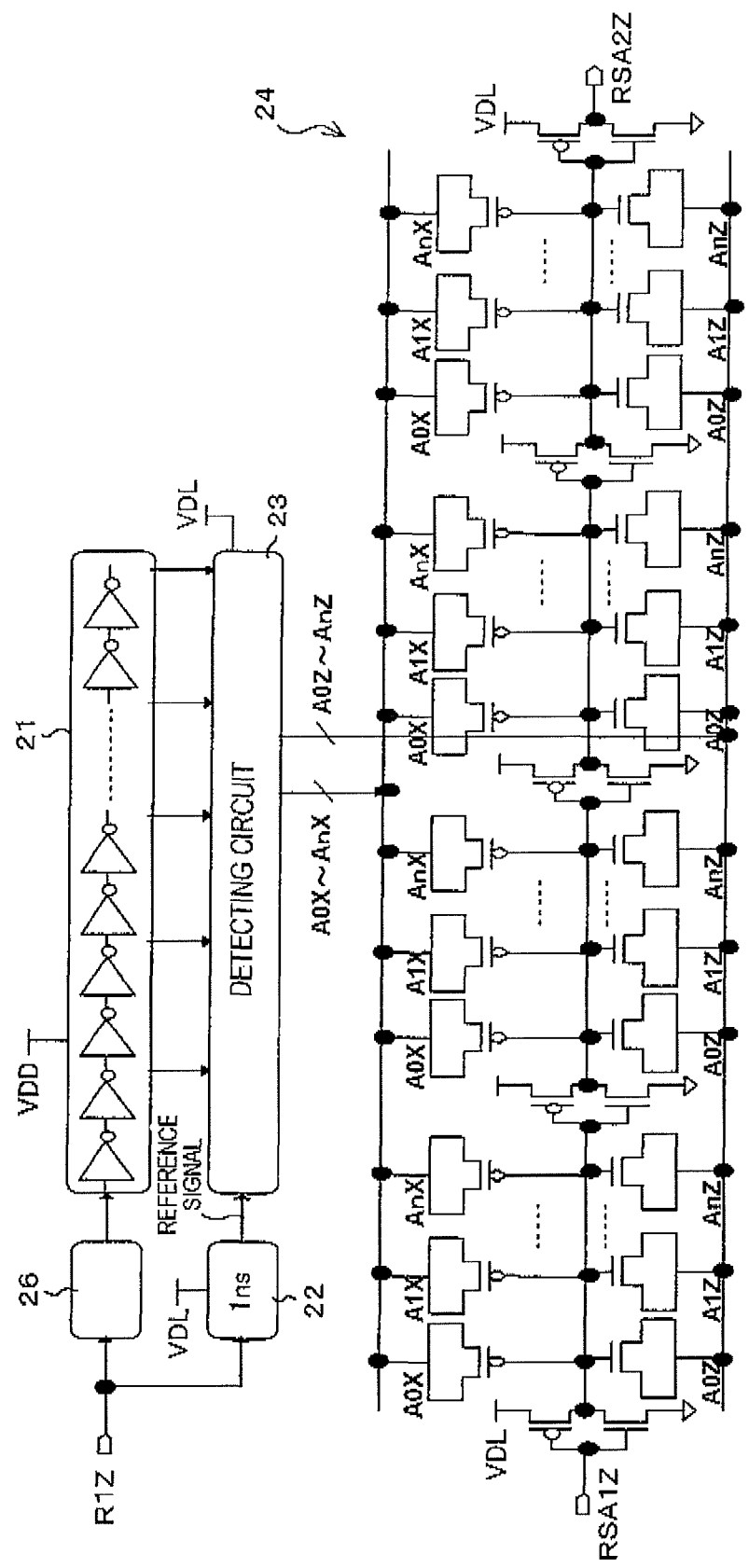
FIG. 6 is a circuit diagram showing another configurational example of a second delay circuit.

The arrangement for changing the delay of second delay circuit 24 depending on output signals A0Z to AnZ and A0X to AnX from detecting circuit 23 is not limited to the current source control elements combined with the inverters as described above, but may be of other designs. For example, as shown in FIG. 6, the loads on the inverters of second delay circuit 24 may be changed depending on output signals A0Z to AnZ and A0X to AnX from detecting circuit 23 by load elements such as capacitors for changing time constants for charging or discharging. Alternatively, the load elements may be resistors, or a combination of capacitors and resistors.

In FIG. 6, second delay circuit 24 comprises a plurality of series-connected CMOS inverters each having an output terminal connected to the input terminal of the following inverter. Every adjacent two of the CMOS inverters are connected to each other at a junction that is connected to the gates of (n+1) load P-channel MOS transistors each having a drain and a source connected to each other and the gates of (n+1) load N-channel MOS transistors each having a drain and a source connected to each other. The drains and sources of the (n+1) load N-channel MOS transistors are supplied with output signals A0Z to AnZ from detecting circuit 23, respectively, and the drains and sources of the (n+1) load P-channel MOS transistors are supplied with output signals A0X to AnX from detecting circuit 23, respectively.

When output signals AiZ supplied from detecting circuit 23 to the drains and sources of the load N-channel MOS transistors are low, the gate capacitances and channel resistances of the load transistors serve as output loads on the CMOS inverters. When output signals AiZ supplied from detecting circuit 23 to the drains and sources of the load N-channel MOS transistors are high, the gate capacitances and channel resistances of the load transistors do not serve as output loads on the CMOS inverters. Similarly, when output signals AiX supplied from detecting circuit 23 to the drains and sources of the load P-channel MOS transistors are high, the gate capacitances and channel resistances of the load transistors serve as output loads on the CMOS inverters. When output signals AiX supplied from detecting circuit 23 to the drains and sources of the load P-channel MOS transistors are low, the gate capacitances and channel resistances of the load transistors do not serve as output loads on the CMOS inverters. As the output loads are greater, the delays of the inverters are greater. Therefore, the greater the number of high output signals AiZ from detecting circuit 23, the shorter the delay time of second signal RSA1Z propagating through second delay circuit 24. Conversely, the smaller the number of high output signals AiZ from detecting circuit 23, the longer the delay time of second signal RSA1Z propagating through second delay circuit 24.

With the circuit arrangement shown in FIG. 6, by establishing the delay time for signal propagation in reference delay circuit 22 and characteristics of the current source control elements of second delay circuit 24 based on the correlation between the first delay variation of the analog circuit and the second delay variation of the digital circuit, it is possible to match the delay of second delay circuit 24 to the delay of the analog circuit due to the variation in first power supply voltage VDD. In FIG. 6, the number of load transistors connected to the junction between every two adjacent inverters may be smaller than the number of detectors of detecting circuit 23.

Figure 7:
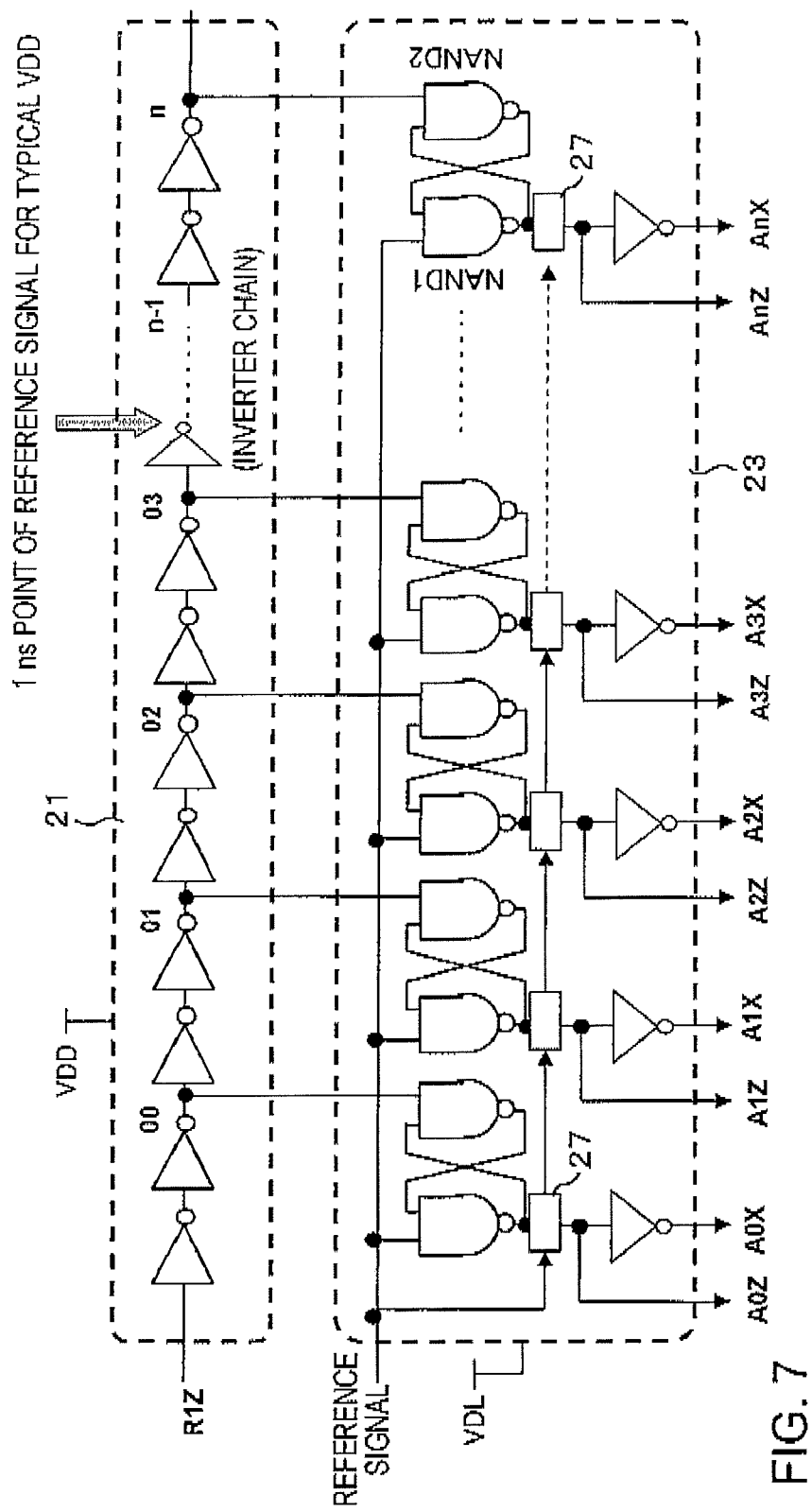
FIG. 7 is a circuit diagram showing a semiconductor device according to Example 2.

A semiconductor device according to Example 2 will be described below with reference to FIG. 7.

In the semiconductor device according to Example 1, first signal R1Z is applied to first delay circuit 21 and reference delay circuit 22 immediately before control signal RSA2Z for controlling the analog circuit is generated from signal RSA1Z. Though the semiconductor device according to Example 1 allows the delay of second delay circuit 24 to be changed depending on an abrupt variation in first power supply voltage VDD, it poses limitations on the timing of signal RSA1Z.

According to Example 2, detecting circuit 23 additionally includes determining and holding circuits 27 in the semiconductor device according to Example 1. Determining and holding circuits 27 comprise latch circuits, for example, which operate based on the reference signal. Determining and holding circuits 27 are provided to produce respective output signals A0Z to AnZ of detecting circuit 23. Specifically, determining and holding circuits 27 are combined with the respective detectors of detecting circuit 23 so as to receive the output signals from the first NAND gates of the detectors. Determining and holding circuits 27 output respective signals AiZ which are output from detecting circuit 23. Output signals AiZ from determining and holding circuits 27 are also applied to respective inverters, which invert signals AiZ into signals AiX that are also output from detecting circuit 23.

Figure 8:
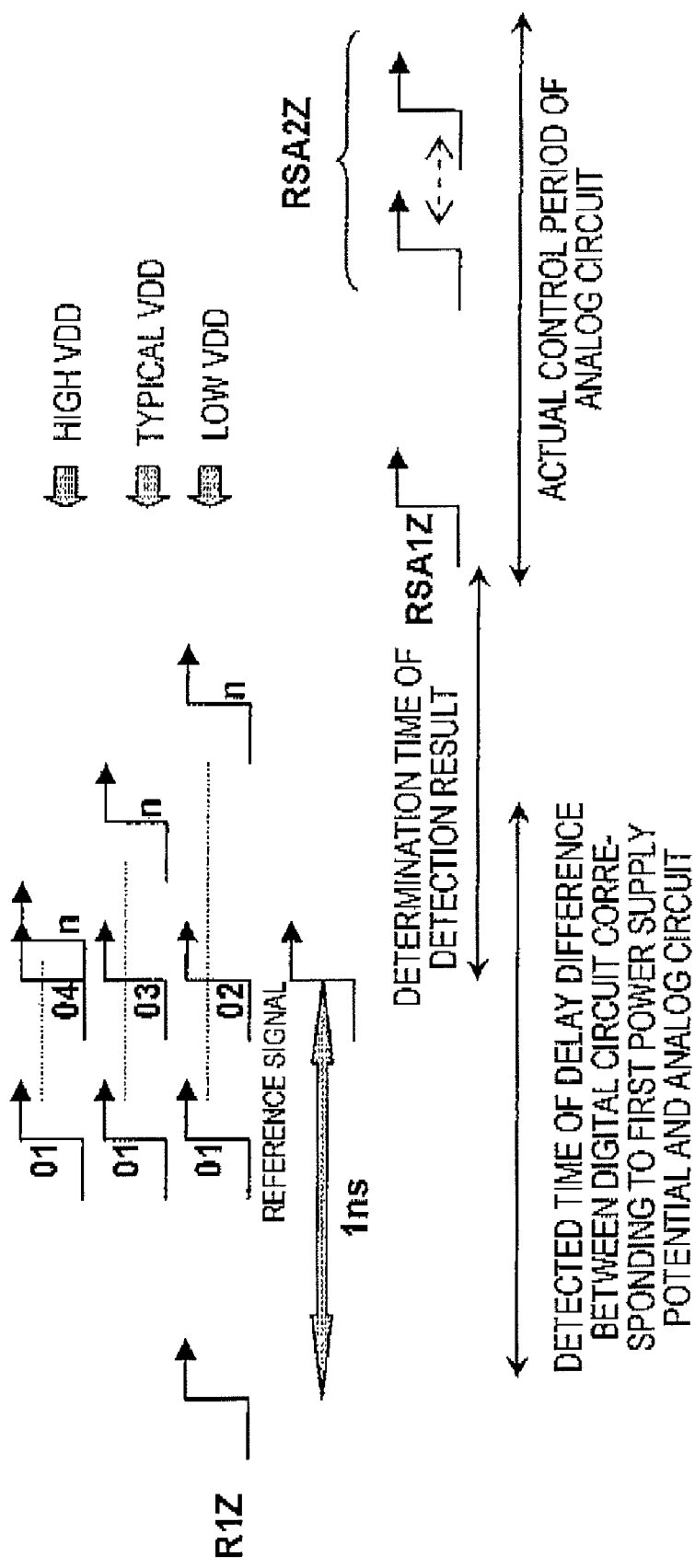
FIG. 8 is a diagram illustrating the operation of the semiconductor device of Example 2.

FIG. 8 is a waveform diagram showing how the detected value from detecting circuit 23 and the delay of second delay circuit 24 are associated with each other.

Determining and holding circuits 27 added to detecting circuit 13 make it possible to flexibly establish the timing of signal RSA1Z irrespectively of the timing of first signal R1Z.

A specific example of the semiconductor device according to the present invention will be described below.

Figure 9:
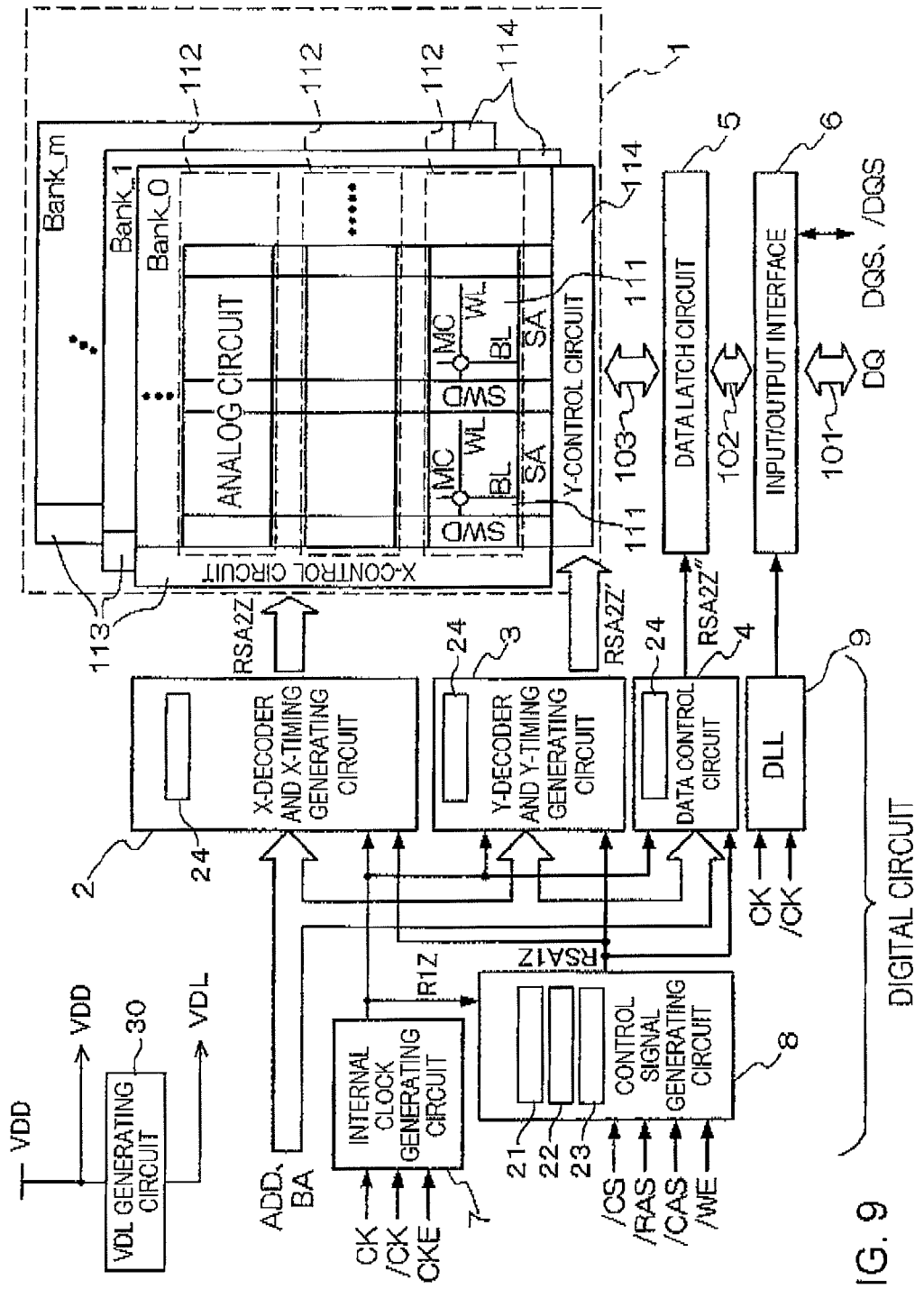
FIG. 9 is a block diagram showing an overall arrangement of a semiconductor memory device as an example of the semiconductor device according to the exemplary embodiment.

FIG. 9 is a block diagram of an overall arrangement of a semiconductor memory device, i.e., a DRAM, as an example of the semiconductor device according to the exemplary embodiment.

As shown in FIG. 9, the semiconductor memory device comprises memory array 1, X-decoder and X-timing generating circuit 2, Y-decoder and Y-timing generating circuit 3, data control circuit 4, data latch circuit 5, input/output interface 6, internal CLK (clock) generating circuit 7, control signal generating circuit 8, DLL (Delay Locked Loop) circuit 9, and VDL generating circuit 30. At least memory array 1 operates under power supply voltage VDD supplied from an external circuit outside of the semiconductor device. Power supply voltage VDD corresponds to the first power supply voltage referred to above. VDL generating circuit 30, which comprises a regulator circuit or a step down circuit, generates internal power supply voltage VDL which remains substantially constant even if power supply voltage VDD varies. Internal power supply voltage VDL corresponds to the second power supply voltage referred to above.

Memory array 1 comprises a number of memory cells MC each of which holds data. Memory array 1 is constructed as an analog circuit connected to data latch circuit 5 by data transfer bus 103. Data latch circuit 5 is connected to input/output interface 6 by data transfer bus 102. Input/output interface 6 inputs and outputs data (DQ) from and to an external circuit through data transfer bus 101 and also inputs and outputs data strobe signals DQS, /DQS. The data transfer between memory array 1, data latch circuit 5, and input/output interface 6 is controlled by data control circuit 4. The timing to input and output data (DQ) and also to output data strobe signals DOS, /DQS from input/output interface 6 is controlled by DLL circuit 9 which is supplied with clock signals CK, /CK from an external circuit.

Data latch circuit 5 serves to latch output signals from memory array 1 at a timing that is controlled by timing signal RSA2Z" output from data control circuit 4. The timing of output signals from memory array 1 as an analog circuit greatly varies as power supply voltage VDD varies. Therefore, the timing signal output from data control circuit 4 corresponds to a signal for controlling the analog circuit.

Memory array 1 includes a plurality of memory mats 111 each comprising a plurality of memory cells MC disposed at the intersections of a plurality of word lines WL and a plurality of bit lines BL. An array of memory mats 111 serves as a memory mat array 112, and a plurality of memory mat arrays 112 make up a bank. Illustrated memory array 1 includes (m+1) banks (Bank_0, Bank_1, . . . , Bank_m) where m represents an integer of 1 or greater. Each of the banks is combined with X-control circuit 113 and Y-control circuit 114. Each memory mat 111 is surrounded by a sense amplifier area (SA) including a sense amplifier array which comprises a plurality of sense amplifiers amplifying information read from memory cells MC and a sub-word driver area (SWD) including a sub-word driver array which comprises a plurality of sub-word driver circuits driving a plurality of word lines WL.

Memory array 1 is controlled by X-decoder and X-timing generating circuit 2 and Y-decoder and Y-timing generating circuit 3, which are controlled by control signal generating circuit 8. Particularly, X-decoder and X-timing generating circuit 2 controls X-control circuits 113 of the respective banks, and Y-decoder and Y-timing generating circuit 3 controls Y-control circuits 114 of the respective banks. X-decoder and X-timing generating circuit 2 and Y-decoder and Y-timing generating circuit 3 deliver signals RSA2Z and RSA2Z' for controlling memory array 1 to memory array 1.

Internal clock generating circuit 7 generates an internal clock signal to be supplied to X-decoder and X-timing generating circuit 2, Y-decoder and Y-timing generating circuit 3, and control signal generating circuit 8, based on clock signals CK, /CK and clock enable signal CKE supplied from an external circuit. Control signal generating circuit 8 outputs control signals to X-decoder and X-timing generating circuit 2, Y-decoder and Y-timing generating circuit 3, and data control circuit 4 based on chip select signal /CS, row address strobe signal /RAS, column address strobe signal /CAS, and write enable signal /WE. Address ADD and bank address BA are given to X-decoder and X-timing generating circuit 2, Y-decoder and Y-timing generating circuit 3, and data control circuit 4. The internal clock signal supplied to control signal generating circuit 8 from internal clock generating circuit is assumed as first signal R1Z and the output signals of control signal generating circuit 8 are assumed as signals RSA1Z.

A plurality of power supply circuits supplying high-potential electric power to the sense amplifiers, e.g., a plurality of step down circuits which lowers power supply voltages, are omitted from illustration in FIG. 1.

In this arrangement, X-decoder and X-timing generating circuit 2, Y-decoder and Y-timing generating circuit 3, data control circuit 4, internal clock circuit 7, control signal generating circuit 8, and DLL circuit 9 are constructed as digital circuits. X-decoder and X-timing generating circuit 2, Y-decoder and Y-timing generating circuit 3, and data control circuit 4 comprise digital circuits outputting control signals to control memory array 1 which is an analog circuit. When power supply voltage VDD varies to vary the operational speed and operation timing of memory array 1, then these control signals need to be output at a timing depending on the operational speed of memory array 1. Therefore, each of X-decoder and X-timing generating circuit 2, Y-decoder and Y-timing generating circuit 3, and data control circuit 4 incorporates second delay circuit 24 according to the exemplary embodiment described above. Second delay circuit 24 in X-decoder and X-timing generating circuit 2 controls known time intervals for analog circuit sections from word lines WL to sense amplifiers SA or known overdrive times for sense amplifiers SA. Second delay circuit 24 in Y-decoder and Y-timing generating circuit 3 controls known time intervals for analog circuit sections from data latches in sense amplifiers SA to Y-control circuit 114. Second delay circuit 24 in data control circuit 4 controls known time intervals for analog circuit sections from Y-control circuit 114 to data latch circuit 5.

Circuits, such as first delay circuit 21, reference delay circuit 22, and detecting circuit 23 according to the above exemplary embodiment, which control second delay circuits 24 as digital circuits for controlling delay characteristics of the analog circuit areas are incorporated in control signal generating circuit 8. Although not shown in FIG. 9, first delay circuit 21 is supplied with power supply voltage VDD, and reference delay circuit 22, detecting circuit 23, and second delay circuit 24 are supplied with internal power supply voltage VDL.

VDL generating circuit 30 will be described below. VDL generating circuit 30 comprises a known step down circuit generating second power supply voltage VDL as an internal power supply voltage from first power supply voltage VDD supplied from an external circuit. VDL generating circuit 30 is configured to generate prescribed constant internal power supply potential VDL regardless of potential changes of external power supply VDD. VDL generating circuit 30 has flat output voltage characteristics against potential variations in voltage VDD. Strictly speaking, however, VDL generating circuit 30 has a slight output potential gradient against potential variations in external power supply VDD due to PVT (dispersions in production, voltage and temperature) or the like. Such an output potential gradient is very small compared with potential variations in external power supply potential VDD, e.g., 1% of potential variations in potential VDD. As the output potential gradient of VDL generating circuit 30 is too small to adversely affect the operating principles of the present invention, VDL generating circuit 30 can be regarded as having substantially constant output voltage characteristics.

Figure 10:
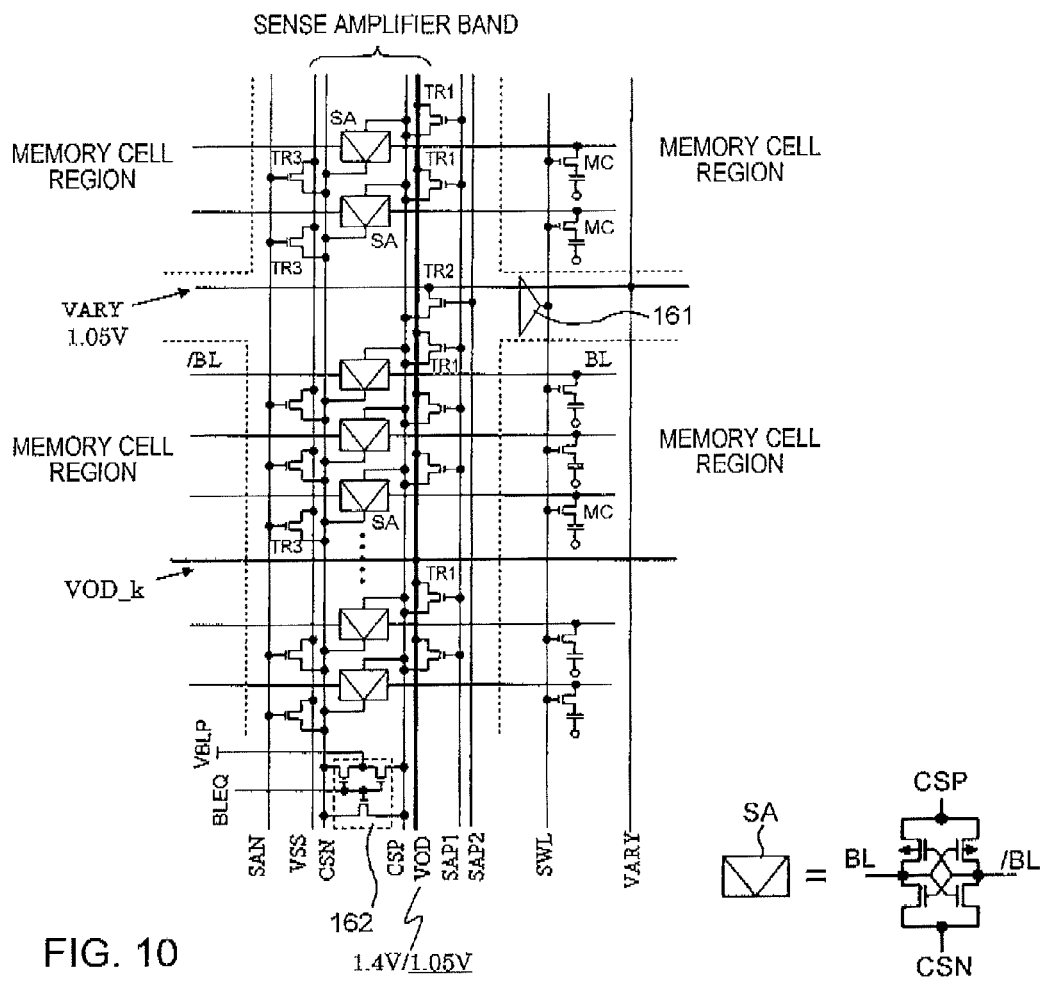
FIG. 10 is a circuit diagram showing a configuration of a memory mat.

FIG. 10 shows by way of example a circuit arrangement of memory mat 111 of each bank. Memory mat 111 is divided into a plurality of memory cell areas each comprising a plurality of memory cells MC. Each of memory cells MC is of a standard configuration including one transistor and one capacitor. The transistors of memory cells MC have respective gates connected to sub-word line SWL which extends vertically in FIG. 10, i.e., in the Y-axis direction, so that memory cells MC are arranged in a column in FIG. 10. The transistors of memory cells MC have respective drains connected respectively to a plurality of bit lines BL which extends horizontally in FIG. 10, i.e., in an X-axis direction. Though only one column of memory cells is illustrated, memory mat 111 includes a plurality of columns of memory cells MC. The transistors of a plurality of memory cells belonging to another column have respective drains connected to a plurality of bit lines /BL. Bit line BL and bit line /BL make up a bit line pair. Memory mat 111 includes sub-row decoder 161 which decodes sub-word line SWL. Sub-word line SWL and sub-row decoder 161 shown in FIG. 10 correspond respectively to word line WL and the sub-word driver shown in FIG. 9. A plurality of sub-row decoders 161 make up a sub-word driver array extending in the X-axis direction.

Sense amplifier SA comprises a flip-flop circuit including two cross-coupled inverters, and is of a general configuration comprising two P-channel FETs (field effect transistors) and two N-channel FETs. Sense amplifier SA has two input nodes connected respectively to bit line BL and bit line /BL. A sense amplifier is connected to each bit line pair. Therefore, a plurality of sense amplifiers are arranged in a vertical array in FIG. 10, making up a sense amplifier band or a sense amplifier column. The sense amplifier band includes high-potential drive signal line CSP, i.e., a line CSP for a sense amplifier drive signal on P-channel side, and a low-potential drive signal line CSN, i.e., a line CSN for a sense amplifier drive signal on N-channel side. Each of sense amplifiers SA is connected to lines CSP, CSN. Equalizing circuit 162 which equalizes the potentials on lines CSP, CSN to potential VBLP with equalizing signal BLEQ is also connected to lines CSP, CSN. Potential VBLP is one-half of array voltage VARY which is supplied as an operating voltage to memory array 1, for example. Equalizing circuit 162 is of a general configuration which comprises two transistors for connecting a line for potential VBLP to lines CSP, CSN, respectively, and one transistor for connecting lines CSP, CSN to each other, the transistors having respective gates supplied with equalizing signal BLEQ. Although not shown, each bit line pair is associated with a similar equalizing circuit for equalizing the potentials on bit lines BL, /BL to potential VBLP with equalizing signal BLEQ.

Lines CSP, CSN serve to supply an operating power supply voltage to sense amplifiers SA at operation timings to be described later. Since the DRAM employs an overdrive process for driving sense amplifiers SA, the sense amplifier band also includes a line for ground potential VSS and a line for overdrive voltage VOD. A line for array voltage VARY extends across the sense amplifier band. The line for overdrive voltage VOD serves as a line for overdrive voltage VOD_k to be described later, where "k" indicates that the overdrive voltage is applied to bank k. The sense amplifier band also includes lines for timing signals SAN, SAP1, SAP2 for controlling the operation of the sense amplifiers. A plurality of transistors TR1 whose gates are controlled by timing signal SAP1 are connected between the line for overdrive voltage VOD and line CSP. Transistors TR1 are associated respectively with sense amplifiers SA and disposed physically closely to sense amplifiers SA. A plurality of transistors TR2 whose gates are controlled by timing signal SAP2 are connected between the line for array voltage VARY and line CSP. In the illustrated example, transistors TR1, TR2 operate as CSP drive transistors for supplying a potential to line CSP. One transistor TR1 is assigned to each sense amplifier SA, and one transistor TR2 is assigned to a plurality of sense amplifiers SA. In other words, transistor TR2 is disposed in a crossing region where the sense amplifier column and the sub-word driver array cross each other. In memory array 1, the total number of transistors TR1 is greater than the total number of transistors TR2. The total current drive capability of transistors TR1 is greater than the total current drive capability of transistors TR2. A plurality of transistors TR3 whose gates are controlled by timing signal SAN are connected between line CSN and ground potential VSS. One transistor TR3 is assigned to each sense amplifier SA.

Operation of the DRAM will be described below with reference to a timing chart shown in FIG. 11.

The DRAM employs an overdrive process at the time the sense amplifiers start to operate. Particularly, different overdrive voltages are applied in a normal mode of operation for outputting data read from memory cells to an external circuit and a refresh mode of operation for storing again data read from memory cells back into the memory cells. In the refresh mode, as the limitations on the timing of operation of the sense amplifiers are lessened, an overdrive voltage lower than in the normal mode is used. Although not shown, the DRAM includes first and second step down circuits generating a relatively high overdrive voltage of +1.4 V, for example, a third step down circuit generating a relatively low overdrive voltage of +1.05 V, for example, and a fourth step down circuit generating array voltage VARY of +1.06 V, for example. The first step down circuit is supplied with activating signal VODEN_VODP_k, the second step down circuit with activating signal VODEN_VDD1_k, the third step down circuit with activating signal VODEN_VDD2_k, and the fourth step down circuit with activating signal VARYEN. FIG. 11 also shows signal SENSOK indicative of the timing at which the sense amplifiers essentially finish their operation, and signal SELFSENSE indicative of a self refresh mode. Of the signals shown in FIG. 11, signal SENSOK and signal SELFSENSE are generated by internal CLK generating circuit 7, and timing signals SAP1, SAP2 and activating signals VODEN_VODP_k, VODEN_VDD1_k, VODEN_VDD2_k, and VARYEN are generated by control signal generating circuit 8, and delayed depending on a variation in external power supply voltage VDD by second delay circuits 24 provided in X-decoder and X-timing generating circuit 2 and Y-decoder and Y-timing generating circuit 3.

Figure 11:
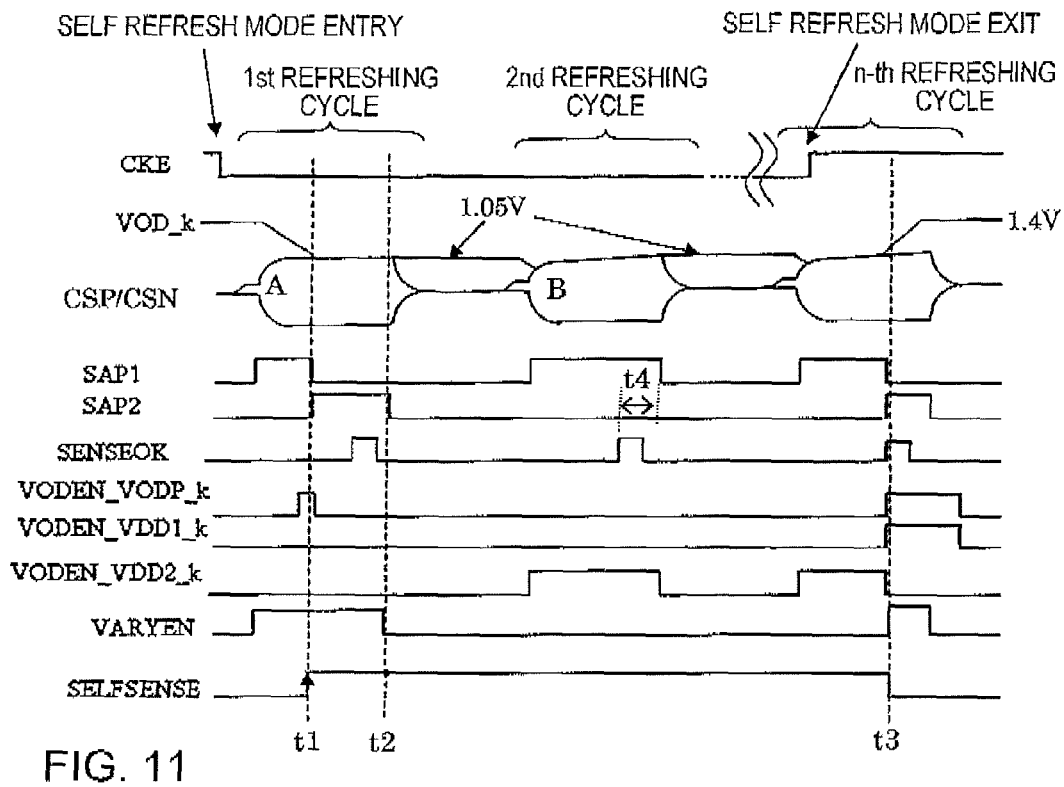
FIG. 11 is a waveform diagram showing the operation timing of the semiconductor memory device shown in FIG. 9.

The timing chart shown in FIG. 11 is representative of the refresh mode of operation as a whole. However, in FIG. 11, if the waveforms between time t1 and time t3 are removed and the waveform prior to time t1 and the waveform subsequent to time t3 are joined to each other, the resultant waveform represents sensing operation in the normal mode.

First, the operation timing in the normal mode of operation will be described below.

After initial sensing, timing signal SAP1 is rendered low and timing signal SAP2 is rendered high, supplying the voltage from the line for array voltage VARY to line CSP. Timing signals SAP1, SAP2 are switched at time t1 in FIG. 11. Since the operation is in the normal mode, the processes shown between time t1 and time t3 is not performed and the signals are processed from time t3 immediately after time t1. Activating signal VODEN_VODP_k that is supplied to the first step down circuit and activating signal VARYEN that is supplied to the fourth step down circuit are rendered active earlier than time t1 in order to make up for delays in the response speeds of the first and fourth step down circuits. Activating signal VODEN_VDD2_k that is supplied to the third step down circuit for generating a relatively low overdrive voltage is low in level and hence is inactive at all times, so that the third step down circuit does not operate.

Immediately after signal SENSEOK goes high, timing signal SAP2 goes low. Thereafter, the potentials on lines CSP, CSN quickly converge to an equalized potential, and the potential on line VOD_k converges to +1.4 V, for example. The DRAM changes from the sensing operation in the normal mode to the standby mode.

The operation timing in the refresh mode of operation will be described below.

When clock enable signal CKE supplied from an external circuit to the DRAM goes low and becomes inactive, the DRAM changes from the normal mode of operation to the self refresh mode of operation, i.e., self refresh mode entry occurs. At this time, since the potential on line VOD_k is the same as the potential in the normal mode, the DRAM operates in the same manner as in the normal mode after the self refresh entry until timing signal SAP2 goes high and the power supply voltage for driving line CSP switches to array voltage VARRY. In the refresh mode, timing signal SAP2 rises at time t1 and simultaneously signal SELFSENSE changes from the low level to the high level. After the power supply voltage for driving line CSP switches to array voltage VARRY, the potential on line VOD_k remains to be of the level (e.g., +1.05 V) which is level at the end of the initial sensing operation. In a first refreshing cycle after the DRAM has entered the self refresh mode, since line SCP is driven at the same voltage (e.g., +1.4 V) as in the normal mode of operation, the potential on line CSP rises with a good waveform. However, as signal SELFSENSE has been activated and the first and second step down circuits for generating a relatively high overdrive voltage are not operated, the potential on line VOD_k does not return to +1.4 V. At time t2, activating signal VARYEN falls at the same time that timing signal SAP2 falls.

From a next refreshing cycle on, i.e., from a second refreshing cycle on, only timing signal SARI and activating signal VODEN_VDD2_k supplied to the third step down circuit are activated and other activating signals VODEN_VODP_k, VODEN_VDD1_k, and VARYEN are not activated in the sensing period. The potential on line VOD_k is kept at array voltage VARY of +1.05 V, for example. From an initial stage of the sensing operation, line CSP is energized to array voltage VARY of +1.05 V, for example, by transistors TR1 in the memory array in response to timing signal SAP1.

The above refresh mode of operation is repeated from the second refreshing cycle to an (n−1)-th refreshing cycle. Thereafter, it is assumed that in an n-th refreshing cycle, clock enable signal CKE goes high, and the DRAM leaves the self refresh mode, i.e., comes to a self refresh mode exit. At this time, the potential on line VOD_k is the same as array voltage VARY, and the DRAM is unable to immediately perform the overdrive operation as in the normal mode of operation. Therefore, even after the self refresh mode exit, the DRAM operates in the same manner as in the self refresh mode until signal SENSEOK indicative of the time when the sensing operation is essentially finished goes high. At the same time that signal SENSEOK goes high at time t3, signal SELFSENSE goes low and becomes inactive. Timing signal SAP1 goes low and timing signal SAP2 goes high, and line CSP is disconnected from line VOD_k and connected to the line for array voltage VARY. In addition, at time t3, activating signals VODEN_VODP_k, VODEN_VDD1_k go high, causing the first and second step down circuits to resume their operation. The potential on line VOD_k recovers +1.4 V, for example, preparing the DRAM for the sensing operation in a next normal mode.

The waveform of the potential on line CSP in each refreshing cycle will be discussed below. The positive-going edge, indicated by B in FIG. 11, of the voltage on line CSP in the second and subsequent refreshing cycles which is energized by the relatively low overdrive voltage (e.g., +1.05 V) is naturally slower than the positive-going edge, indicated by A in FIG. 11, of the voltage on line CSP in the first refreshing cycle which is energized by the relatively high overdrive voltage (e.g., +1.4 V). In the refreshing cycles which do not require external access, unlike the normal mode of operation which requires quick external access, no problem is caused by such a slower positive-going edge of the voltage on line CSP.

If timing signal SAP1 is disabled and line CSP is energized in the refresh mode by only timing signal SAP2 which is to be used for applying array voltage VARY to line CSP in a later stage of the sensing operation in the normal mode, then the positive-going edge of the voltage on line CSP will be more prolonged than the positive-going edge indicated by B in FIG. 11 because of lower driving capability of transistor TR2 and the like. In the example shown in FIG. 11, line CSP is energized by timing signal SAP1. If transistors TR2 are energized parallel to each other by timing signal SAP2, then although their current driving capability is smaller than the total current driving capability of transistors TR1, their assistive function works to make the positive-going edge of the voltage on line CSP faster.

In each of the second to (n−1)-th refreshing cycles, timing signal SAP2 does not go high and hence remains inactive, and timing signal SAP1 remains high for a longer period of time than in the normal mode of operation, Time period t4 from the positive-going edge of signal SENSEOK to the negative-going edge of timing signal SAP1 is longer than a time period from the positive-going edge of signal SENSEOK to the negative-going edge of timing signal SAP2 in the normal mode of operation. This reflects a delay in the time period for restoring data in the memory cells due to the low voltage applied to line CSP. The period for restoring data in the memory cells refers to a time period from the start of the sensing operation until the time when the potential on one of bit lines BL, /BL connected to the sense amplifiers reaches 95% of array voltage VARY.

Figure 12:
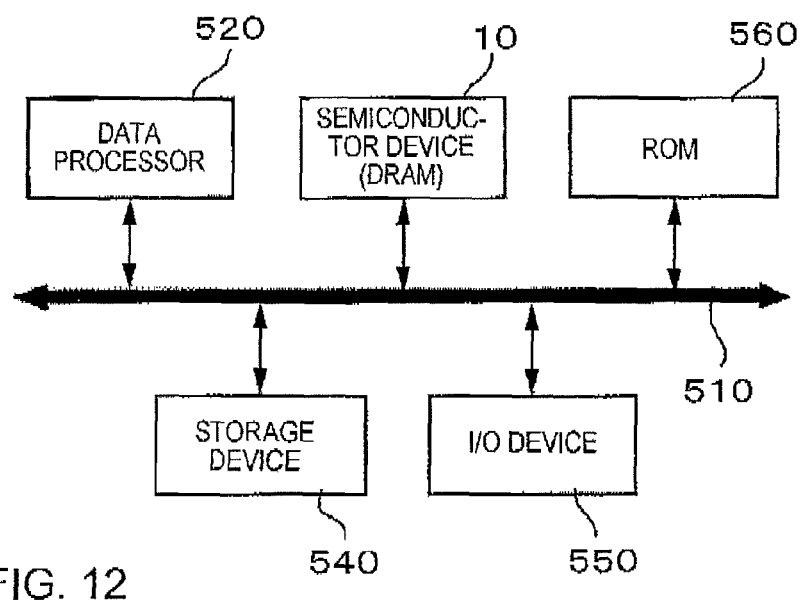
FIG. 12 is a block diagram showing an example of a data processing system which incorporates the semiconductor device according to the exemplary embodiment.

FIG. 12 is a block diagram showing by way of example data processing system 500 incorporating semiconductor device 10 according to the exemplary embodiment. In data processing system 500, semiconductor device 10 according to the exemplary embodiment is constructed as a DRAM.

As shown in FIG. 12, data processing system 500 includes data processor 520 connected to semiconductor device 10 (DRAM) according to the present embodiment by system bus 510. Data processor 520 should preferably, but not necessarily, comprise a microprocessor (MPU), a digital signal processor (DSP), or the like. In FIG. 12, data processor 520 and DRAM 10 are connected to each other by system bus 510 for the sake of brevity, but may alternatively be connected to each other by a local bus, not system bus 510.

In FIG. 12, only one system bus 510 is illustrated for the sake of brevity. However, a plurality of system buses may be provided in a series or parallel layout in association with connectors.

Data processing system 500 also includes storage device 540, I/O (input and output) device 550, and ROM (read only memory) 560 which are connected to system bus 510. However, storage device 540, I/O device 550, and ROM 560 are not indispensable components of data processing system 500.

Storage device 540 may comprise a hard disk drive, an optical disk drive, a flash memory, or the like. I/O device 550 may comprise a display device such as a liquid crystal display unit, or an input device such as a keyboard, a mouse, or the like. I/O device 550 may either one of an input device and an output device.

Each of the components shown in FIG. 12 comprises a single device for the sake of brevity. However, one or more of the components shown in FIG. 12 may comprise a plurality of devices each.

In one embodiment, the controller, e.g., data processor 520, which controls DRAM 10 issues a read command or write command to DRAM 10 and receives corresponding data from DRAM 10. In DRAM 10, the digital circuit controls the analog circuit based on the read command or write command. If the read command is applied, then the digital circuit reads corresponding data from the analog circuit and outputs the data to system bus 510. If the write command is applied, the digital circuits stores corresponding external data in the analog circuit. The commands issued by the controller refer to system commands for controlling known semiconductor devices, stipulated by JEDEC (Joint Electron Device Engineering Council) Solid State Technology Association.

The exemplary embodiments and examples of the present invention have been described above. However, the basic technical concept of the present invention is not limited to the above exemplary embodiments and examples. Specifically, a dynamic semiconductor memory, i.e., a DRAM, has been described as the semiconductor device according to the exemplary embodiment. However, the basic technical concept of the present invention may be applied to other semiconductor devices. For example, the principles of the present invention are applicable to a wide range of semiconductor devices including analog and digital circuits, including a CPU (Central Processing Unit), an MCU (Micro Control Unit), a DSP (Digital Signal Processor), an ASIC (Application Specific Integrated Circuit), an ASSP (Application Specific Standard Circuit), etc. Product forms of semiconductor devices to which the present invention is applicable include an SOC (System On Chip), an MCP (Multi-Chip Package), a POP (Package On Package), etc. The principles of the present invention are applicable to semiconductor devices in such product forms and package forms. The present invention is also applicable to semiconductor devices or systems wherein analog and digital circuits are incorporated in individual semiconductor chips.

The transistors of the semiconductor devices to which the present invention is applicable may comprise field effect transistors (FETs) or bipolar transistors. FETs may be MOS (Metal Oxide Semiconductor) FETs, MIS (Metal Insulator Semiconductor) FETs, TFT (Thin Film Transistor) FETs, etc. The principles of the present invention are also applicable to semiconductor devices including both bipolar transistors and FETs.

A P-channel transistor or a PMOS transistor is an example of a transistor of first conductivity type, and an N-channel transistor or a NMOS transistor is an example of a transistor of second conductivity type. A semiconductor substrate for use in a semiconductor device may be a P-type semiconductor substrate, an N-type semiconductor substrate, an SOI (Silicon On Insulator) semiconductor substrate, or any of other semiconductor substrates.

The various elements disclosed herein may be combined or selected in various ways within the scope of the appended claims of the present invention. It is apparent that the present invention covers various changes and modifications which those skilled in the art could conceive based on the entire disclosure and technical concept of the present invention including the scope of the appended claims.

What is claimed is:

1. A semiconductor device comprising:
   an analog circuit with a first delay variation in response to a variation in a power supply potential, said analog circuit being connected to a first power supply potential; and
   a digital circuit with a second delay variation smaller than said first delay variation in response to the variation in the power supply potential, said digital circuit generating a control signal to control said analog circuit;
   said digital circuit comprising:
   a first circuit connected to said first power supply potential and provided with a first delay caused when the first circuit is supplied with a first signal and propagates said first signal in relation to said second delay variation;
   a detecting circuit outputting a detected value corresponding to said first delay; and
   a second circuit connected to a second power supply potential whose potential variation is smaller than said first power supply potential,
   wherein said second circuit is supplied with a second signal and generates said control signal which has a second delay in relation to said second delay variation;
   wherein said second delay is controlled to change from said second delay variation to said first delay variation in correlation to the first delay which is indicated by said detected value.

2. The device according to claim 1, wherein said first power supply potential comprises a power supply potential externally supplied to the device, said device further comprising:
   an internal power supply circuit generating a constant potential from said first power supply potential irrespectively of a variation in said first power supply potential, and outputting the generated constant potential as the second power supply potential.

3. The device according to claim 1, further comprising:
   a signal generating circuit generating said first signal and said second signal, wherein a transition time of said first signal is earlier than a transition time of said second signal.

4. The device according to claim 3, wherein said signal generating circuit is activated in response to external access made to said device, to generate said first signal and said second signal.

5. The device according to claim 1, wherein said digital circuit includes a reference delay circuit with said second delay variation, said reference delay circuit being connected to said second power supply potential and supplied with said first signal,
   wherein said reference delay circuit generates a reference signal from said first signal and outputs the generated reference signal to said detecting circuit, and
   wherein said detecting circuit outputting said detected value based on a transition time of said reference signal.

6. The device according to claim 1, wherein said first circuit includes a plurality of delay elements each including an output terminal of a previous delay element connected to an input terminal of a following delay element, said first signal being supplied to the input terminal of a first one of the delay elements, and
   wherein said detecting circuit comprises a plurality of detectors connected to the respective output terminals of said delay elements, said reference signal being supplied in common to said detectors, and said detectors that outputs respective detected signals representative of said detected value.

7. The device according to claim 6, wherein said detecting circuit includes determining and holding circuits connected respectively to output terminals of the detectors.

8. The device according to claim 1, wherein said second circuit includes:
   a plurality of logic gates each having an output terminal of a previous logic gate connected to an input terminal of a following logic gate, said second signal being supplied to the input terminal of a first one of the logic gates, said control signal being supplied from the output terminal of a last one of the logic gates; and
   at least one of a first current source control element and a second current source control element, said first current source control element being connected between a first power supply terminal of at least one of said logic gates and a power supply line of said second power supply potential, and said second current source control element being connected between a second power supply terminal of at least one of said logic gates and a power supply line of a third power supply potential lower than said second power supply terminal, and wherein the detected value output from said detecting circuit is supplied to at least one of said first current source control element and said second current source control element.

9. The device according to claim 1, wherein said second circuit includes:
   a plurality of logic gates each having an output terminal of a previous logic gate connected to an input terminal of a following logic gate, said second signal being supplied to the input terminal of a first one of the logic gates, said control signal being supplied from the output terminal of a last one of the logic gates; and
   a load element connected to an output terminal of at least one of said logic gates, and
   wherein the detected value output from said detecting circuit is supplied to said load element.

10. A method of controlling a semiconductor device including an analog circuit with a first delay variation in response to a variation in a power supply potential, and a digital circuit with a second delay variation smaller than said first delay variation in response to the variation in the power supply potential, said digital circuit including a first circuit and a second circuit, and said digital circuit outputting a control signal to control said analog circuit, said method comprising:
   propagating a first signal through said first circuit which is supplied with a first power supply potential and provided with said second delay variation;
   detecting a first delay caused when said first signal is propagated through said first circuit; and
   controlling a second delay of said second circuit to change from said second delay variation to said first delay variation in correlation to the detected first delay,
   wherein said second circuit is supplied with a second power supply potential whose potential variation is smaller than said first power supply potential, and said second circuit generates said control signal to control said analog circuit.

11. The method according to claim 10, wherein a second signal is propagated through said second circuit, and the propagated second signal serves as said control signal.

12. The method according to claim 11, wherein said semiconductor device includes a reference delay circuit with said second delay variation as said digital circuit, which is supplied with said second power supply potential, and detects said first delay, further comprising:
   propagating said first signal through said reference delay circuit to generate a reference signal; and
   detecting said first delay caused when said first signal is propagated through said first circuit, based on said reference signal.

13. The method according to claim 12, wherein said first circuit comprises a plurality of series-connected delay elements, and
   wherein said detecting of said first delay includes comparing potentials at a plurality of output terminals correspondingly respectively to said delay elements based on a transition time of said reference signal.

14. The method according to claim 12, wherein said first signal and said second signal are related to each other, said first signal transits in a time earlier than said second signal transits in time.

15. The method according to claim 12, further comprising:
   holding the detected first delay.

16. The method according to claim 11, wherein said second circuit comprises a plurality of series-connected delay elements and at least one of a first current source control element and a second current source control element, said first current source control element being connected between a first power supply terminal of at least one of said logic gates and a power supply line of said second power supply potential, said second current source control element being connected between a second power supply terminal of at least one of said logic gates and a power supply line of a third power supply potential lower than said second power supply terminal, and
   wherein the method includes controlling at least one of said first current source control element and said second current source control element in correlation to the detected first delay.

17. The method according to claim 11, wherein said second circuit comprises a plurality of series-connected delay elements, and
   wherein the method includes controlling a load connected to at least one of the delay elements in correlation to the detected first delay.

18. The method according to claim 10, comprising:
   inactivating said semiconductor device prior external access thereof; and
   activating said semiconductor device in response to the external access.

19. A system comprising:
   a system bus;
   a processor connected to said system bus; and
   a semiconductor device connected to said system bus, said semiconductor device comprising:
      an analog circuit with a first delay variation in response to a variation in a power supply potential, said analog circuit being connected to a first power supply potential; and
      a digital circuit with a second delay variation smaller than said first delay variation in response to the variation in the power supply potential, said digital circuit generating a control signal to control said analog circuit,
   wherein said digital circuit comprising:
      a first circuit connected to said first power supply potential and provided with a first delay caused when the first circuit is supplied with a first signal and propagates said first signal in relation to said second delay variation;
      a detecting circuit outputting a detected value corresponding to said first delay; and
      a second circuit connected to a second power supply potential whose potential variation is smaller than said first power supply potential,
   wherein said second circuit is supplied with a second signal and generates said control signal which has a second delay in relation to said second delay variation;
   wherein said second delay is controlled to change from said second delay variation to said first delay variation in correlation to the first delay which is indicated by said detected value.

20. The system according to claim 19, further comprising:
   a first power supply line supplying said first power supply potential to said semiconductor device.

* * * * *